US012463025B2

(12) United States Patent
Moyama et al.

(10) Patent No.: US 12,463,025 B2
(45) Date of Patent: Nov. 4, 2025

(54) PLASMA PROCESSING APPARATUS

(71) Applicant: Tokyo Electron Limited, Tokyo (JP)

(72) Inventors: Kazuki Moyama, Miyagi (JP); Yuzuru Sakai, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 141 days.

(21) Appl. No.: 18/359,163

(22) Filed: Jul. 26, 2023

(65) Prior Publication Data

US 2024/0047184 A1 Feb. 8, 2024

(30) Foreign Application Priority Data

Jul. 28, 2022 (JP) ................................ 2022-120799

(51) Int. Cl.
*H01J 37/32* (2006.01)

(52) U.S. Cl.
CPC .. *H01J 37/32834* (2013.01); *H01J 37/32633* (2013.01); *H01J 37/32715* (2013.01); *H01J 2237/024* (2013.01)

(58) Field of Classification Search
None
See application file for complete search history.

(56) References Cited

U.S. PATENT DOCUMENTS

2004/0020429 A1* 2/2004 Jang .................. C23C 16/45557 118/728
2014/0051253 A1 2/2014 Guha
2020/0051790 A1* 2/2020 Shim ................. H01J 37/32449

FOREIGN PATENT DOCUMENTS

JP 2019-102680 6/2019
JP 2022-076807 5/2022
KR 10-2013-0137959 12/2013

* cited by examiner

*Primary Examiner* — Kenneth B Wells
(74) *Attorney, Agent, or Firm* — IPUSA, PLLC

(57) ABSTRACT

A plasma processing apparatus includes a plasma processing chamber; a substrate support disposed in the plasma processing chamber; a movable member and a stationary member each disposed around the substrate support, the movable member having a plurality of moving blades, the plurality of moving blades being rotatable, the stationary member having a plurality of stationary blades, the plurality of moving blades and the plurality of stationary blades being alternately disposed along a height direction of the plasma processing chamber, and an exhaust space being formed beneath the movable member and the stationary member; a first driver configured to rotate the movable member; a pressure regulating member movably disposed around the substrate support and above the movable member and the stationary member; and a second driver configured to move the pressure regulating member.

20 Claims, 13 Drawing Sheets

PLASMA PROCESSING APPARATUS

CROSS-REFERENCE TO RELATED APPLICATIONS

This patent application is based on and claims priority to Japanese Patent Application No. 2022-120799, filed on Jul. 28, 2022, the entire contents of which are incorporated herein by reference.

BACKGROUND OF THE INVENTION

1. Field of the Invention

The present disclosure herein relates to a plasma processing apparatus.

2. Description of the Related Art

Patent Document 1, for example, proposes an apparatus having multiple moving blades and multiple stationary blades disposed in multiple stages around a substrate support, which is disposed inside a processing container. An exhaust space is formed beneath the multiple moving blades and the multiple stationary blades, and the moving blades are rotatable.

RELATED-ART DOCUMENT

Patent Document

[Patent Document 1] Japanese Laid-open Patent Application Publication No. 2019-102680

SUMMARY OF THE INVENTION

According to one aspect of the present disclosure, a plasma processing apparatus includes a plasma processing chamber; a substrate support disposed in the plasma processing chamber; a movable member and a stationary member each disposed around the substrate support, the movable member having a plurality of moving blades, the plurality of moving blades being rotatable, the stationary member having a plurality of stationary blades, the plurality of moving blades and the plurality of stationary blades being alternately disposed along a height direction of the plasma processing chamber, and an exhaust space being formed beneath the movable member and the stationary member; a first driver configured to rotate the movable member; a pressure regulating member movably disposed around the substrate support and above the movable member and the stationary member; and a second driver configured to move the pressure regulating member.

BRIEF DESCRIPTION OF THE DRAWINGS

Other objects and further features of the present invention will be apparent from the following detailed description when read in conjunction with the accompanying drawings, in which:

FIGS. 1A to 11C are diagrams illustrating an arrangement example 3 of plate members and stationary blades according to the embodiment.

DESCRIPTION OF THE EMBODIMENTS

Figure 1:
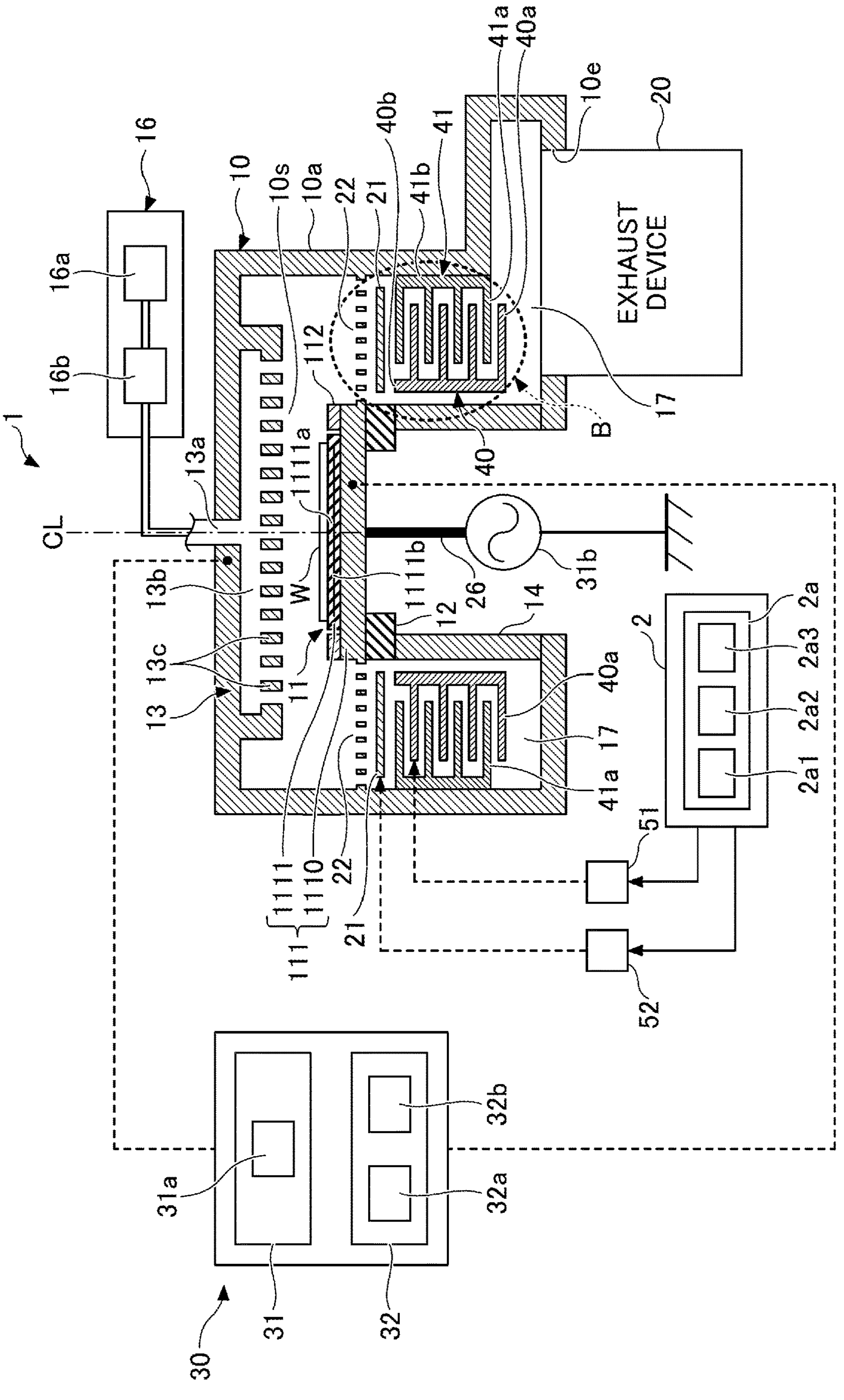
FIG. 1 is a diagram illustrating a configuration example of a plasma processing apparatus according to an embodiment.

In the following, an embodiment of the present disclosure will be described with reference to the drawings. In the drawings, the same components are referenced by the same reference numerals, and duplicated description may be omitted.

In the present specification, in directions such as parallel, perpendicular, orthogonal, horizontal, vertical, up-and-down, and left-and-right, deviations are allowed to such an extent that the effects of the embodiment are not impaired. A shape of a corner is not limited to a right angle and may be rounded in an arcuate shape. Parallel, perpendicular, orthogonal, horizontal, vertical, circular, and coincident may include substantially parallel, substantially perpendicular, substantially orthogonal, substantially horizontal, substantially vertical, substantially circular, and substantially coincident.

Plasma Processing Apparatus

In the following, a configuration example of a plasma processing apparatus is described. FIG. 1 is a diagram illustrating a configuration example of a plasma processing apparatus according to an embodiment.

A plasma processing apparatus 1 is a capacitively coupled plasma processing apparatus. The capacitively coupled plasma processing apparatus 1 includes a plasma processing chamber 10, a gas supply 16, an exhaust device 20, a power supply 30, and a control device 2. The plasma processing apparatus 1 also includes a substrate support 11 and a gas introduction section. The gas introduction section is configured to introduce at least one processing gas into the plasma processing chamber 10. The gas introduction section includes a shower head 13. The substrate support 11 is located in the plasma processing chamber 10. The shower head 13 is located above the substrate support 11. According to the embodiment, the shower head 13 forms at least a portion of the ceiling of the plasma processing chamber 10. The plasma processing chamber 10 has a plasma processing space 10*s* defined by the shower head 13, a side wall 10*a* of the plasma processing chamber 10, and the substrate support 11. The plasma processing chamber 10 has at least one gas supply port for supplying at least one processing gas to the plasma processing space 10*s* and at least one gas exhaust port for discharging the gas from the plasma processing space. The plasma processing chamber 10 is grounded. The shower head 13 and the substrate support 11 are electrically isolated from a housing of the plasma processing chamber 10.

The substrate support 11 includes a body 111 and a ring assembly 112. The body 111 supports a substrate W. A wafer is an example of the substrate W. The substrate W is disposed in the central region of the body 111, and the ring assembly 112 is disposed to surround the substrate W in the central region of the body 111.

According to the embodiment, the body 111 includes a base 1110 and an electrostatic chuck 1111. The base 1110 includes a conductive member. The conductive member of the base 1110 is configured to function as a lower electrode. The electrostatic chuck 1111 is disposed on the base 1110. The electrostatic chuck 1111 includes a ceramic member 1111*a* and an electrostatic electrode 1111*b* disposed within the ceramic member 1111*a*.

The substrate support 11 further includes an insulating member 12 and a support 14. The insulating member 12 is ring-shaped with a thickness similar to that of the body 111, and the support 14 is cylindrical. The support 14 is made of a metal such as aluminum, for example, and is erected from the bottom to the inside of the plasma processing chamber 10 to support the base 1110 through the insulating member 12. The outer diameter of the insulating member 12 and the outer diameter of the support 14 are equal to the diameter of the base 1110. The inner diameter of the support 14 is larger than the inner diameter of the insulating member 12. The internal space defined by the insulating member 12 and the support 14 beneath the base 1110 is the atmospheric space, and a feeding rod 26 is disposed coaxially with the base 1110. The feeding rod 26 and the base 1110 (the substrate support 11) share an axis with the central axis CL of the plasma processing chamber 10. The feeding rod 26 is electrically connected to the base 1110 at the center of a lower surface of the disc-shaped base 1110. A second RF generator 31*b*, which will be described later, is connected to the feeding rod 26 via an impedance matching circuit (not illustrated). Bias RF power is supplied from the second RF generator 31*b* to the base 1110 via the feeding rod 26.

At least one RF/DC electrode coupled to an RF (Radio Frequency) power supply 31 and/or a DC (Direct Current) power supply 32 described below may also be disposed in the ceramic member 1111*a*. In this case, at least one RF/DC electrode functions as a lower electrode. The RF/DC electrode is also called a bias electrode when the bias RF and/or DC signals described below are supplied to at least one RF/DC electrode. The conductive member of the base 1110 and at least one RF/DC electrode may function as multiple lower electrodes. The electrostatic electrode 1111*b* may also function as the lower electrode. Therefore, the substrate support 11 includes at least one lower electrode.

The ring assembly 112 includes one or more annular members. According to the embodiment, one or more annular members include one or more edge rings and at least one covering. The edge ring is made of a conductive or insulating material, and the covering is made of an insulating material.

The substrate support 11 may also include a temperature control module configured to control a temperature of at least one of the electrostatic chuck 1111, the ring assembly 112, and the substrate W to a target temperature. The temperature control module may include a heater, a heat transfer medium, a flow path, or a combination of these. A heat transfer fluid such as brine or gas flows in the flow path. According to the embodiment, a flow path is formed in the base 1110, and one or more heaters are disposed in the ceramic member 1111*a* of the electrostatic chuck 1111. The substrate support 11 may also include a heat transfer gas supply configured to supply a heat transfer gas to a gap between the back of the substrate W and the electrostatic chuck 1111.

The shower head 13 is configured to introduce at least one processing gas from the gas supply 16 into the plasma processing space 10*s*. The shower head 13 has at least one gas supply port 13*a*, at least one gas diffusion chamber 13*b*, and multiple gas introduction ports 13*c*. The processing gas supplied to the gas supply port 13*a* passes through the gas diffusion chamber 13*b* and is introduced into the plasma processing space 10*s* from the multiple gas introduction ports 13*c*. The shower head 13 also includes at least one upper electrode. In addition to the shower head 13, the gas introduction section may include one or more side gas injectors (SGI) attached to one or more openings formed in the side wall 10*a*.

The gas supply 16 may include at least one gas source 16*a* and at least one flow controller 16*b*. According to the embodiment, the gas supply 16 is configured to supply at least one processing gas from the corresponding gas source 16*a* to the shower head 13 via the corresponding flow controller 16*b*. Each flow controller 16*b* may include, for example, a mass flow controller or a pressure-controlled flow controller. In addition, the gas supply 16 may include one or more flow modulation devices that modulate or pulse the flow of at least one processing gas.

The power supply 30 includes an RF power supply 31 that is coupled to the plasma processing chamber 10 via at least one impedance matching circuit. The RF power supply 31 is configured to supply at least one RF signal (RF power) to at least one lower electrode and/or at least one upper electrode. Thus, plasma is formed from at least one processing gas supplied to the plasma processing space 10*s*. Thus, the RF power supply 31 can function as at least part of a plasma generator configured to generate plasma from one or more processing gases in the plasma processing chamber 10. Also, by supplying a bias RF signal to at least one lower electrode, a bias potential is generated in the substrate W, and the ion components in the formed plasma can be attracted into the substrate W.

According to the embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. According to the embodiment, the source RF signal has a frequency in the range of 10 MHz to 150 MHz. According to the embodiment, the first RF generator 31*a* may be configured to generate multiple source RF signals with different frequencies. The generated one or more source RF signals are supplied to at least one lower electrode and/or at least one upper electrode.

The second RF generator 31*b* is coupled to at least one lower electrode via at least one impedance matching circuit, and is configured to generate a bias RF signal (bias RF power). The frequency of the bias RF signal may be the same as or different from the frequency of the source RF signal. According to the embodiment, the bias RF signal has a frequency lower than the frequency of the source RF signal. According to the embodiment, the bias RF signal has a frequency in the range of 100 kHz to 60 MHz. According to the embodiment, the second RF generator 31*b* may be configured to generate multiple bias RF signals with different frequencies. The generated one or more bias RF signals are supplied to at least one lower electrode. Also, in various embodiments, at least one of the source RF signal and the bias RF signal may be pulsed.

The power supply 30 may also include a DC power supply 32 coupled to the plasma processing chamber 10. The DC power supply 32 includes a first DC generator 32*a* and a second DC generator 32*b*. According to the embodiment, the first DC generator 32*a* is connected to at least one lower electrode, and is configured to generate a first DC signal. The generated first bias DC signal is applied to at least one lower electrode. According to the embodiment, the second DC generator 32*b* is connected to at least one upper electrode, and is configured to generate a second DC signal. The generated second DC signal is applied to at least one upper electrode.

In various embodiments, at least one of the first and second DC signals may be pulsed. In this case, a sequence of voltage pulses is applied to at least one lower electrode and/or at least one upper electrode. The voltage pulses may have rectangular, trapezoidal, triangular or a combination of these pulse waveforms. According to the embodiment, a waveform generator configured to generate a sequence of voltage pulses from the DC signal is connected between the first DC generator 32*a* and at least one lower electrode. Therefore, the first DC generator 32*a* and the waveform generator form a voltage pulse generator. When the second DC generator 32*b* and the waveform generator form a voltage pulse generator, the voltage pulse generator is connected to at least one upper electrode. The voltage pulse may have a positive polarity or a negative polarity. The sequence of voltage pulses may also include one or more positive voltage pulses and one or more negative voltage pulses within one period. The first and second DC generators 32*a* and 32*b* may be disposed in addition to the RF power supply 31, and the first DC generator 32*a* may be disposed in place of the second RF generator 31*b*.

A movable member 40 and a stationary member 41 are disposed around the substrate support 11. The movable member 40 has multiple moving blades 40*a*. The stationary member 41 has multiple stationary blades 41*a*. The multiple moving blades 40*a* and the multiple stationary blades 41*a* are alternately disposed along the height direction (vertical direction) of the plasma processing chamber 10. The movable member 40 and the stationary member 41 share an axis with the central axis CL.

The multiple moving blades 40*a* are fixed to a cylindrical member 40*b* extending in the height direction (vertical direction) with an interval. The stationary blades 41*a* are disposed between the vertically adjacent moving blades 40*a*. The cylindrical member 40*b* is disposed outside along the periphery of the support 14. The inner diameter of the cylindrical member 40*b* is larger than the outer diameter of the support 14. A first driver 51 is configured to rotate the movable member 40 such that the multiple moving blades 40*a* can rotate about the center axis CL. That is, in the movable member 40, as the cylindrical member 40*b* rotates around the center axis CL, the multiple moving blades 40*a* circumferentially disposed at respective heights can rotate as a whole.

The multiple stationary blades 41*a* are fixed to the cylindrical member 41*b* extending in the height direction with an interval. The moving blades 40*a* are disposed between the vertically adjacent stationary blades 41*a*. The cylindrical member 41*b* is fixed to the side wall 10*a* of the plasma processing chamber 10. Thus, the multiple stationary blades 41*a* are fixed and do not rotate.

The pressure regulating member 21 is positioned around the substrate support 11 and above the movable member 40 and the stationary member 41. The pressure regulating member 21 shares an axis with the central axis CL. The second driver 52 is configured to move the pressure regulating member 21 such that the pressure regulating member 21 can move up and down. The pressure regulating member 21, the movable member 40, and the stationary member 41 are made of, for example, an alloy of aluminum. The alloy of aluminum may be surface-treated by anodization or ceramic spraying.

Figure 2:
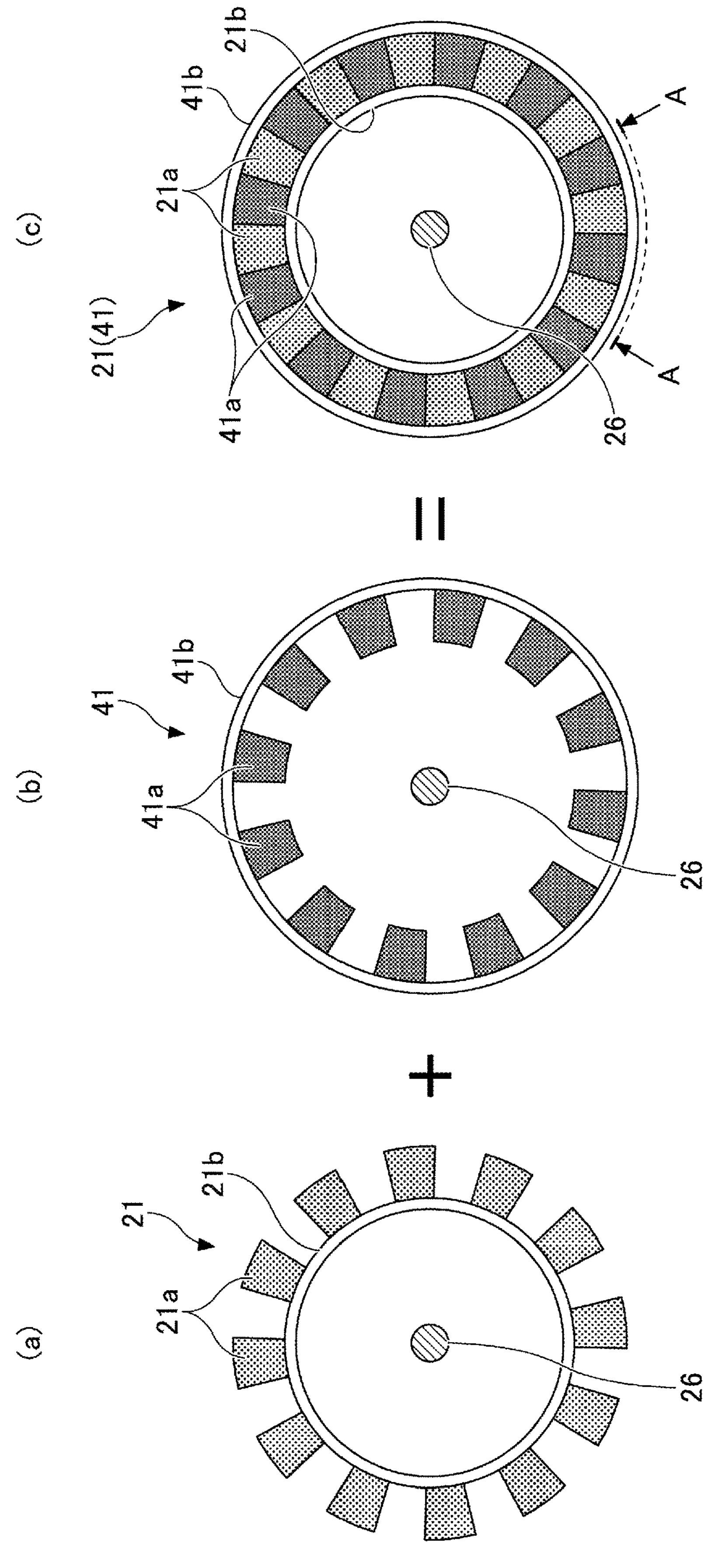
FIG. 2 is a plan diagram illustrating a pressure regulating member and a stationary member according to the embodiment.

FIG. 2 is a plan diagram illustrating the pressure regulating member 21 and the stationary member 41 according to the embodiment. In FIG. 2, illustration of the insulating member 12 and the support 14 of the substrate support 11 are omitted. In addition, the moving blades 40*a* of the movable member 40 are not illustrated in FIG. 2 because the moving blades 40*a* are superimposed beneath the pressure regulating member 21 illustrated in (a) of FIG. 2 and the stationary member 41 illustrated in (b) of FIG. 2 disposed directly beneath the pressure regulating member 21.

With reference to FIG. 1 and (a) of FIG. 2, the pressure regulating member 21 has multiple plate members 21*a* circumferentially disposed around the substrate support 11. Each of the multiple plate members 21*a* has the same shape and size. The inner surfaces of the multiple plate members 21*a* are fixed to the outer surface of a ring member 21*b*, and are evenly disposed in the circumferential direction of the ring member 21*b*. The inner diameter of the ring member 21*b* is larger than the outer diameters of the insulating member 12 and the support 14.

As illustrated in (b) of FIG. 2, the stationary member 41 has multiple stationary blades 41*a* and a cylindrical member 41*b* circumferentially disposed around the substrate support 11. Each of the multiple stationary blades 41*a* has the same shape and size. The outer surfaces of the multiple stationary blades 41*a* are fixed to the inner surface of the cylindrical member 41*b*, and are evenly disposed in the circumferential direction of the cylindrical member 41*b*.

Although not illustrated in FIG. 2, the movable member 40 has the multiple moving blades 40*a* and the cylindrical member 40*b* circumferentially disposed around the substrate support 11. Each of the multiple moving blades 40*a* of the movable member 40 has the same shape and size. The inner surfaces of the multiple moving blades 40*a* are fixed to the outer surface of the cylindrical member 40*b*, and are evenly disposed in the circumferential direction of the cylindrical member 40*b*. The inner diameter of the cylindrical member 40*b* is larger than the outer diameters of the insulating member 12 and the support 14.

According to the configuration of the pressure regulating member 21, the stationary member 41, and the movable member 40, the feeding rod 26, the pressure regulating member 21, the stationary member 41, and the movable member 40 are coaxially disposed.

As illustrated in (c) of FIG. 2, the multiple plate members 21*a* and the multiple stationary blades 41*a* are disposed alternately in the circumferential direction. There appears no gap between the plate members 21*a* and stationary blades 41*a* that are adjacently disposed in plan view. However, as described later, a gap having a predetermined dimension or less may be provided between the plate members 21*a* and the stationary blades 41*a* that are adjacently disposed in plan view. In addition, the adjacent disposed plate members 21*a* and stationary blades 41*a* may partially overlap in plan view. In addition, the multiple plate members 21*a* and the multiple stationary blades 41*a* may have, but are not limited to having, the same shape and size.

The multiple moving blades 40*a* and the multiple stationary blades 41*a* are alternately disposed in the circumferential direction. The multiple moving blades 40*a* and the multiple stationary blades 41*a* may have, but are not limited to having, the same shape and size.

In FIGS. 1 and 2, a (first) stationary blade 41*a* is disposed directly beneath the pressure regulating member 21, and moving blades 40*a* and stationary blades 41*a* are alternately disposed beneath the (first) stationary blade 41*a*, but the configuration is not limited to this example. A (first) moving blade 40*a* may be disposed directly beneath the pressure regulating member 21, and stationary blades 41*a* and moving blades 40*a* may alternately be disposed beneath the (first) moving blade 40*a*. In this case, (b) of FIG. 2 would illustrate a movable member 40 of the same shape instead of the stationary member 41.

Returning to FIG. 1, a baffle plate 22 is disposed above the pressure regulating member 21. The baffle plate 22 is ring-shaped and shares an axis with the central axis CL. Multiple through-holes (e.g. holes) are formed in the baffle plate 22 to regulate the flow of gas. However, the configuration of the baffle plate 22 is not limited to this example, and may have at least one movable baffle plate 22 above the pressure regulating member. In addition, two baffle plates 22 may be disposed in the vertical direction. Note that the baffle plates 22 may be omitted.

An exhaust space 17 is formed beneath the movable member 40 and the stationary member 41. The exhaust device 20 can be connected, for example, to a gas exhaust port 10*e* disposed at a lower portion of the plasma processing chamber 10. The exhaust device 20 may include a pressure regulating valve and a vacuum pump. The pressure regulating valve regulates the pressure in the plasma processing space 10*s*. The vacuum pump may include a turbomolecular pump, a dry pump, or a combination of these. There may be one or more gas exhaust ports 10*e*.

The control device 2 processes computer-executable instructions that cause the plasma processing apparatus 1 to perform the various processes described in the present disclosure. The control device 2 can be configured to control each element of the plasma processing apparatus 1 to perform the various processes described here. According to the embodiment, part or all of the control device 2 may be included in the plasma processing apparatus 1. The control device 2 may include a processor 2*al*, a storage 2*a*2, and a communication interface 2*a*3. The control device 2 is implemented by, for example, a computer 2*a*. The processor 2*al* can be configured to perform various control operations by reading a program from the storage 2*a*2 and executing the read program. The program may be stored in advance in the storage 2*a*2 or acquired via a medium when necessary. The acquired program is stored in the storage 2*a*2, is read from the storage 2*a*2, and is executed by the processor 2*a*1. The medium may be a variety of storage media readable by the computer 2*a*, or may be a communication line connected to the communication interface 2*a*3. The processor 2*al* may be a CPU (Central Processing Unit). The storage 2*a*2 may include a RAM (Random Access Memory), a ROM (Read Only Memory), an HDD (Hard Disk Drive), an SSD (Solid State Drive), or a combination of these. The communication interface 2*a*3 may communicate with the plasma processing apparatus 1 via a communication line such as a LAN (Local Area Network).

In the plasma processing apparatus 1, the substrate W is processed with plasma generated in the plasma processing space 10*s*. During the substrate processing, the plasma processing apparatus 1 performs exhaust processing to control the pressure in the plasma processing space 10*s*. The exhaust processing is performed by the control device 2 to control the exhaust device 20, the first driver 51, and the second driver 52. The exhaust processing performed by the plasma processing apparatus 1 will be described.

The control device 2 acquires a measured value of a pressure from a pressure sensor (not illustrated) that measures the pressure in the plasma processing space 10*s*. The control device 2 controls the presence or absence of rotation and the rotational speed of the multiple moving blades 40*a* according to the differential pressure between the measured value of the pressure and a predetermined set value of the pressure (target value). For example, when the measured value of the pressure is higher than the set value, the control device 2 can transmit an instruction signal to the first driver 51 to increase the rotational speed of the multiple moving blades 40*a* in order to increase the conductance of the gas. When the measured value of the pressure is lower than the set value, the control device 2 can transmit an instruction signal to the first driver 51 to decrease the rotational speed of the multiple moving blades 40*a* in order to decrease the conductance of the gas.

Furthermore, according to the present disclosure, as described later with reference to FIGS. 3A to 8F, the control device 2 controls up and down (vertical) movement of the pressure regulating member 21, according to the differential pressure between the measured value of the pressure and the set value. For example, when the measured value of the pressure is higher than the set value, the control device 2 can transmit an instruction signal to the second driver 52 to raise the pressure regulating member 21 to increase the conductance of the gas. When the measured value of the pressure is lower than the set value, the control device 2 can transmit an instruction signal to the second driver 52 to lower the pressure regulating member 21 to decrease the conductance of the gas.

The exhaust device 20 is disposed at an asymmetrical position at the bottom of the plasma processing chamber 10. Therefore, the exhaust device exhausts a gas within the plasma processing space 10*s* and the exhaust space 17 in an asymmetrical manner toward the gas exhaust port 10*e*. When the movable member 40 and the stationary member 41 are not disposed, a portion of the exhaust space 17 near the exhaust device 20 has a pressure lower than that of a portion of the exhaust space 17 away from the exhaust device 20. As a result, the pressure distribution in the exhaust space 17 is asymmetrical. As a result, the pressure distribution in the plasma processing space 10*s* is also asymmetrical, and the characteristics of substrate processing, such as the etching rate, tend to vary in the circumferential direction.

In the plasma processing apparatus 1 having such a configuration, the ring-shaped pressure regulating member 21, the movable member 40, and the stationary member 41 are disposed coaxially with the base 1110, such that the asymmetry of the gas conductance in the circumferential direction can be eliminated, and the symmetry of the gas conductance in the circumferential direction can be maintained. Moreover, by arranging the feeding rod 26 coaxially with the base 1110, the asymmetry of the impedance in the circumferential direction with respect to the RF power can be eliminated, and the symmetry of the RF power supply in the circumferential direction can be maintained.

In addition, the multiple moving blades 40*a* are rotated and their rotational speed is controlled to prevent the excessive decrease in the conductance of the gas and to make a flow of the processing gas in the exhaust space 17. As a result, the pressure above the movable member 40 and the stationary member 41 can be made uniform, variations in the characteristics such as the etching rate in the circumferential direction during the substrate processing can be reduced, and the substrate W can be processed more uniformly.

Furthermore, according to the present embodiment, the exhaust efficiency of the processing gas can be further enhanced by the configurations and operations of the pressure regulating member 21, the movable member 40, and the stationary member 41, such that the exhaust pressure in the plasma processing chamber 10 can be controlled more precisely. The configuration and operation examples of the pressure regulating member 21 (multiple plate members 21*a*) and the stationary member 41 (multiple stationary blades 41*a*) for enhancing the exhaust efficiency are described below with reference to FIGS. 3A to 8F.

Figure 3A:
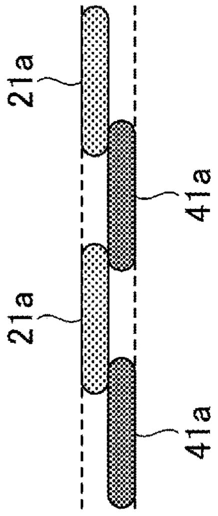
FIGS. 3A to 3C are diagrams illustrating an arrangement of multiple plate members and multiple stationary blades according to a reference example.
Figure 3B:
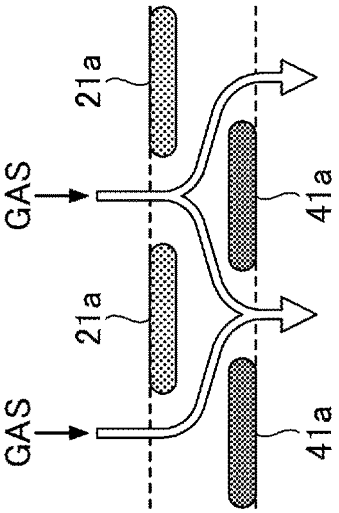
Figure 3C:
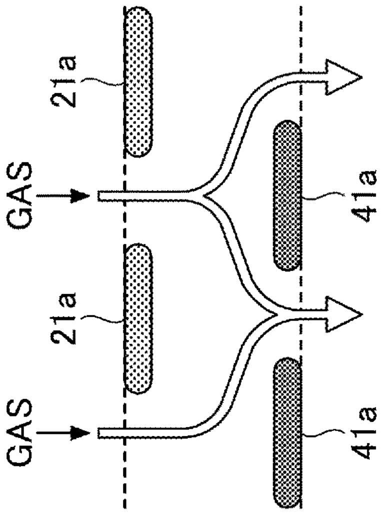
Figure 4:
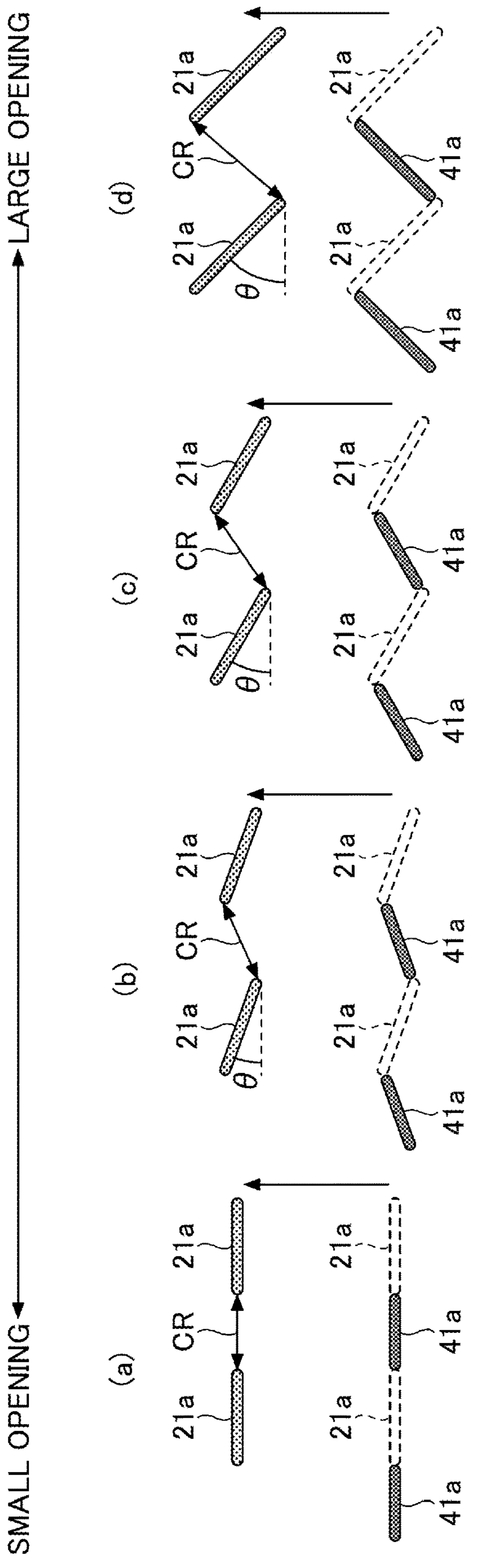
FIG. 4 is a diagram illustrating the arrangement and opening ratio of multiple plate members and multiple stationary blades.

FIGS. 3A to 3C are diagrams illustrating arrangements of multiple plate members 21*a* and multiple stationary blades 41*a* according to a reference example. FIG. 4 is a diagram illustrating arrangements and opening ratios of the multiple plate members 21*a* and the multiple stationary blades 41*a*. FIGS. 5A to 8F are diagrams illustrating arrangements and operation examples 1 to 4 of the multiple plate members 21*a* and the multiple stationary blades 41*a* according to the embodiment. FIGS. 3A to 8F are schematic diagrams illustrating the multiple plate members 21*a* and the multiple stationary blades 41*a* viewed from a side surfaces indicated by A-A in (c) of FIG. 2. FIGS. 3A to 6F are diagrams illustrating two plate members 21*a* and two stationary blades 41*a* viewed from the side surfaces indicated by A-A. FIGS. 7A to 8F are diagrams illustrating five plate members 21*a* and four stationary blades 41*a* viewed from the side surfaces indicated by A-A.

According to the reference example in FIGS. 3A to 3C, the plate members 21*a* and the stationary blades 41*a* are disposed parallel in the direction horizontal to a mounting surface of the substrate W. Hereafter, a space in which the pressure regulating member 21, the movable member 40, and the stationary member 41 beneath the baffle plate 22 are disposed is called an exhaust path. The exhaust path communicates with the exhaust space 17. When the plate members 21*a* are raised from the position of the plate members 21*a* illustrated in FIG. 3A to the positions illustrated in FIG. 3B and FIG. 3C, the exhaust path of the processing gas between the plate members 21*a* and the stationary blades 41*a* expands. As illustrated in (c) of FIG. 2, when the plate members 21*a* and the stationary blades 41*a* are disposed such that the entire exhaust space can be covered by the plate members 21*a* and the stationary blades 41*a* when viewed in plan view, the area of the plate members 21*a* or the stationary blades 41*a* becomes a half or more of the area of the exhaust path when the exhaust path is cut horizontally in cross section. In this case, the opening ratio of the exhaust path (space) of the plate members 21*a* or the stationary blades 41*a* is, for example, 50% or less, which limits the adjustable pressure range regulated by the pressure regulating member 21.

In contrast, as illustrated in FIG. 4, the angle θ is the inclination of the plate member 21*a* in the circumferential direction with respect to the horizontal direction, and the plate member 21*a* is inclined in the circumferential direction. For example, the angle θ of the plate member 21*a* is gradually increased in the order of (b), (c), and (d) of FIG. 4 from the state in (a) of FIG. 4 at 0° to the state of (d) of FIG. 4 at 45°. The distance CR between the nearest points of the adjacent plate members 21*a* illustrated in (a) to (d) of FIG. 4 is smallest when the angle θ is 0° ((a) of FIG. 4), and gradually increases in the order of the distance CR illustrated in (b), (c), and (d) of FIG. 4. That is, the larger the inclination of the plate member 21*a* in the circumferential direction, the wider the distance CR and the higher the opening ratio. The opening ratio is defined as the ratio of the sum of the distance CR to the circumference of the pressure regulating member 21.

From the above description, according to the present disclosure, the multiple plate members 21*a* are disposed non-parallel to the multiple stationary blades 41*a* as illustrated in (b), (c), and (d) of FIG. 4. Thus, the adjustable pressure range by the pressure regulating member 21 can be broadened. With this configuration, the opening ratio can be increased and the conductance of the gas when the processing gas flows from the plasma processing space 10*s* through the exhaust path of the pressure regulating member 21, the movable member 40, and the stationary member 41 to the exhaust space 17 can be controlled with high accuracy. As a result, the control accuracy of the exhaust pressure in the plasma processing chamber 10 can be improved.

It should be noted that the larger the circumferential inclinations of the stationary blades 41*a* with respect to the stationary blades 41*a*, the wider the intervals between the adjacent stationary blades 41*a* and the higher the opening ratio of the stationary member 41. Therefore, the multiple stationary blades 41*a* may be inclined in the circumferential direction with respect to the horizontal direction. Also, the inclinations of the plate members 21*a* may be opposite to the inclinations of the stationary blades 41*a*. The multiple plate members 21*a* are inclined at the same angle in the circumferential direction. The multiple stationary blades 41*a* are inclined at the same angle in the circumferential direction. The multiple plate members 21*a* and the multiple stationary blades 41*a* are inclined only in the circumferential direction and not in the central direction (radial direction).

Operation Example 1

Figure 5A:
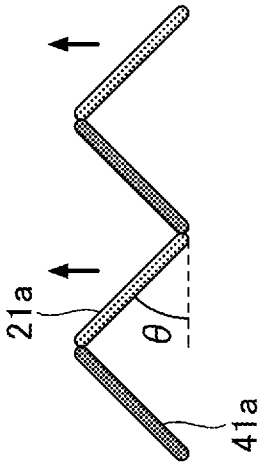
FIGS. 5A to 5F are diagrams illustrating an arrangement and an operation example 1 of multiple plate members and multiple stationary blades according to the embodiment.
Figure 5B:
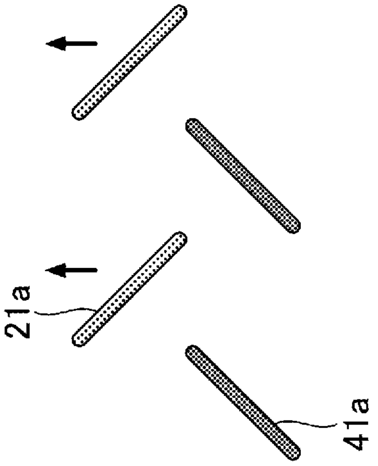
Figure 5C:
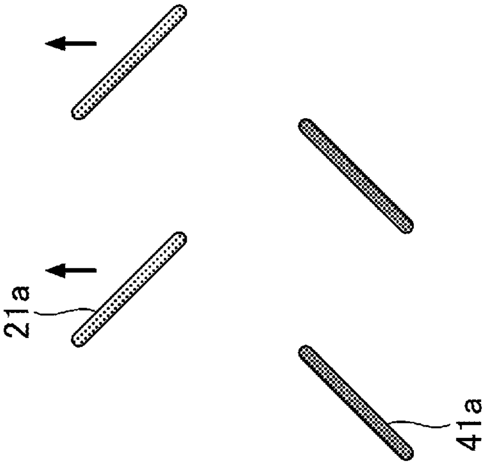
Figure 5D:
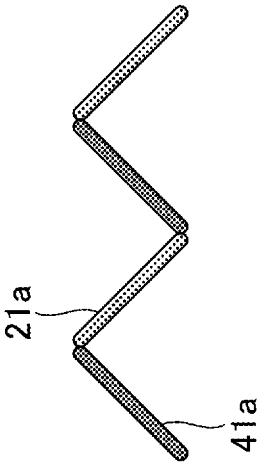
Figure 5E:
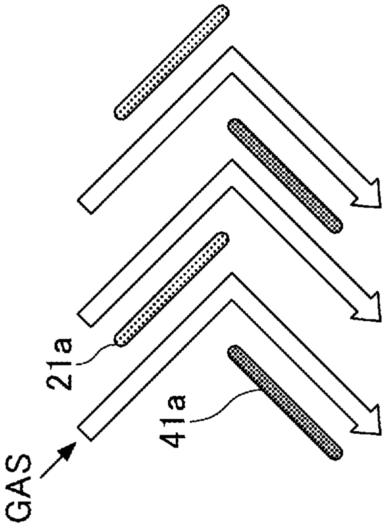
Figure 5F:
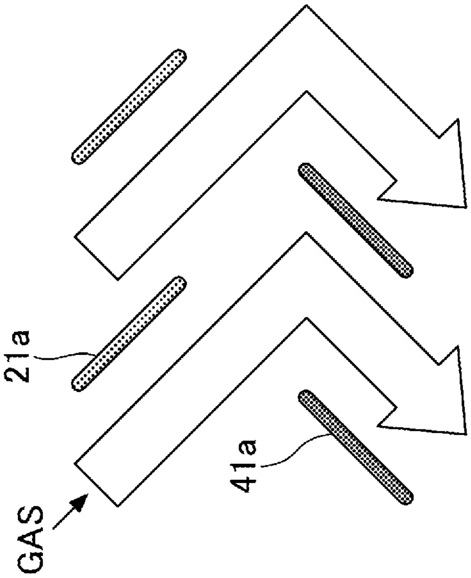

In an operation example 1 illustrated in FIGS. 5A to 5F, the plate members 21*a* move vertically from the positions illustrated in FIG. 5A to the positions illustrated in FIG. 5C. The stationary blades 41*a* are fixed. At the positions illustrated in FIG. 5A, the exhaust path is closed (fully closed) by the plate members 21*a* and the stationary blades 41*a*, so that the processing gas in this operation example does not flow as illustrated in FIG. 5D. At the positions illustrated in FIG. 5B, the exhaust path is partially open, so that the processing gas begins to flow into the exhaust space 17 as illustrated in FIG. 5E. At the positions illustrated in FIG. 5C, the opening ratio is higher than that at the positions illustrated in FIG. 5B and can be 90% or more, so that more processing gas can be controlled to flow into the exhaust space 17 as illustrated in FIG. 5F.

Operation Example 2

Figure 6A:
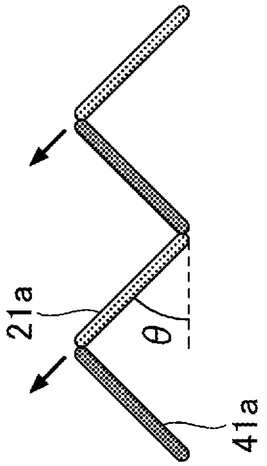
FIGS. 6A to 6F are diagrams illustrating an arrangement and an operation example 2 of multiple plate members and multiple stationary blades according to the embodiment.
Figure 6B:
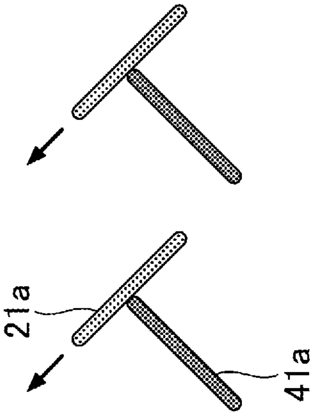
Figure 6C:
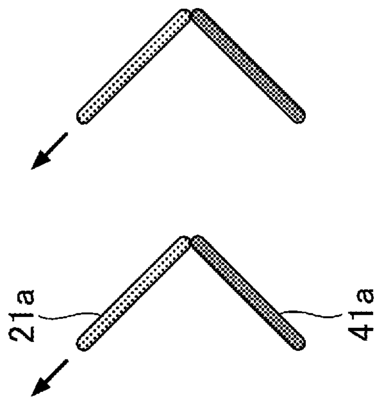
Figure 6D:
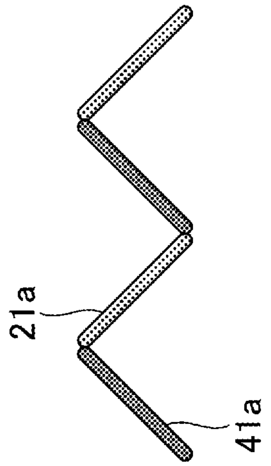
Figure 6E:
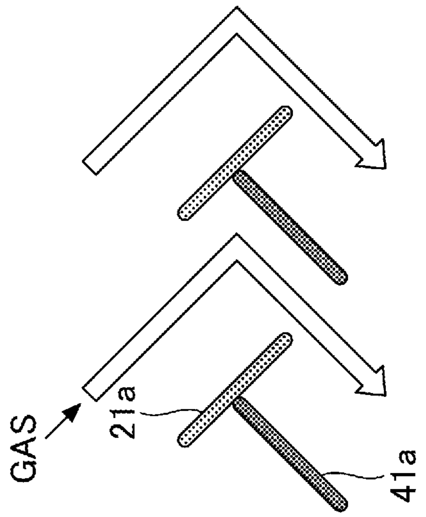
Figure 6F:
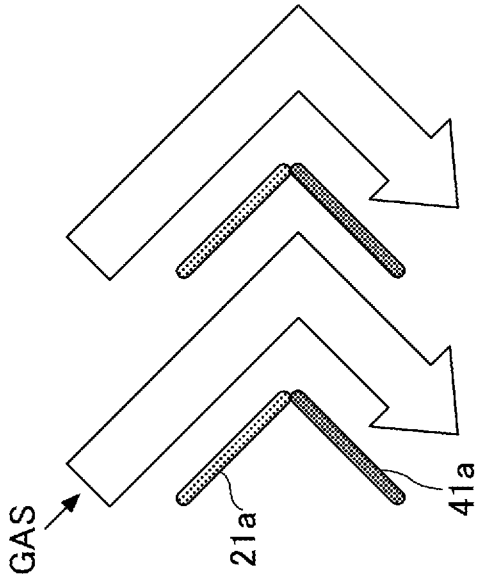

In an operation example 2 illustrated in FIG. 6A to 6F, the plate members 21*a* move up and down obliquely from the positions illustrated in FIG. 6A to the positions illustrated in FIG. 6C. The stationary blades 41*a* are fixed. At the positions illustrated in FIG. 6A, the exhaust path is closed (fully closed) by the plate members 21*a* and the stationary blades 41*a*, so that the processing gas in this operation example does not flow as illustrated in FIG. 6D. Since the exhaust path is partially open at the positions illustrated in FIG. 6B, the processing gas begins to flow into the exhaust space 17 as illustrated in FIG. 6E. At the positions illustrated in FIG. 6C, the opening ratio is higher than that at the positions illustrated in FIG. 6B, and it is possible to increase the opening ratio to 90% or more, so that more processing gas can be controlled to flow into the exhaust space 17 as illustrated in FIG. 6F.

Operation Example 3

Figures 7A, 7B, 7C, 7D, 7E, 7F:
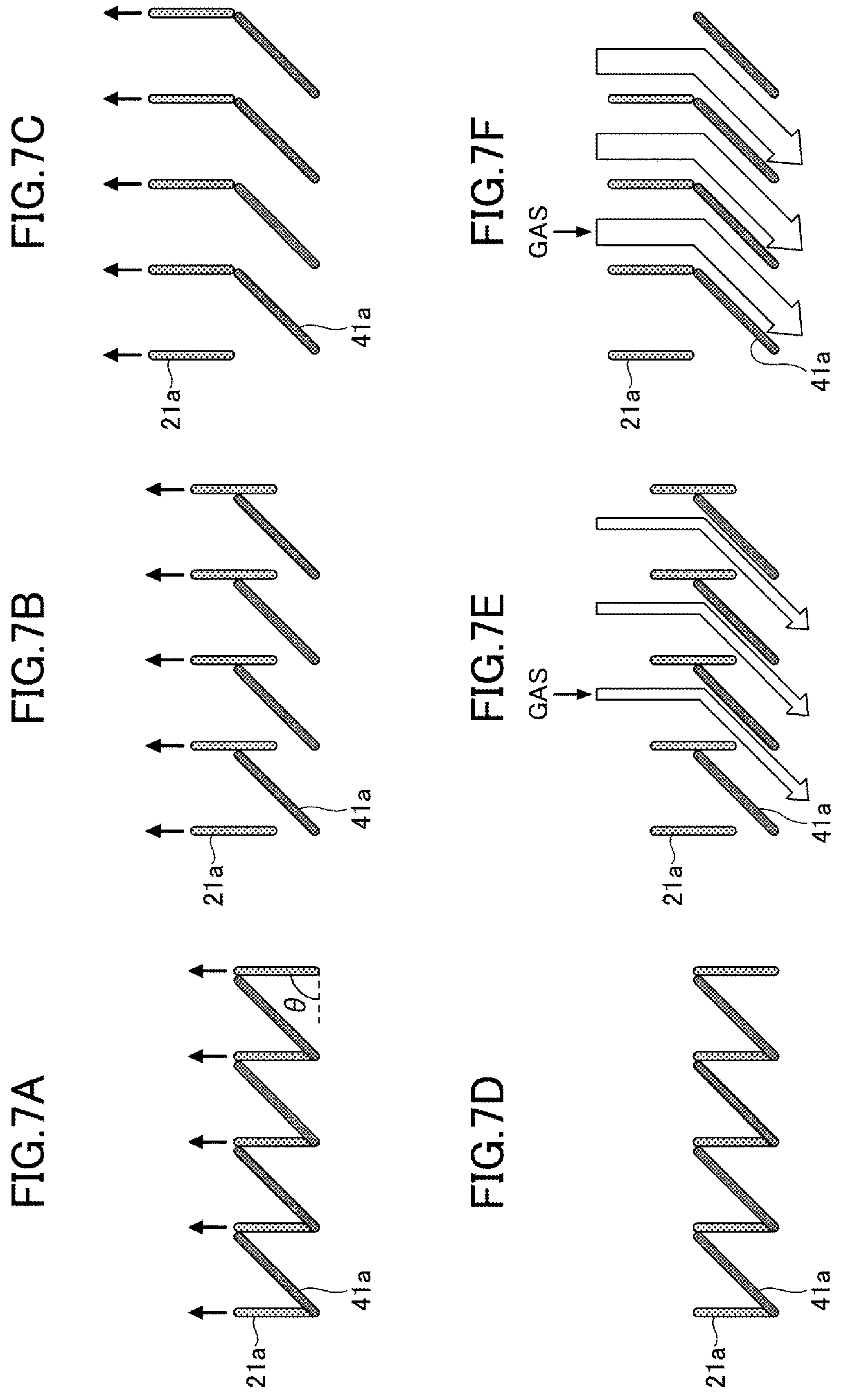
FIGS. 7A to 7F are diagrams illustrating an arrangement and an operation example 3 of multiple plate members and multiple stationary blades according to the embodiment.

In an operation example 3 illustrated in FIGS. 7A to 7F, the plate members 21*a* move vertically from the positions illustrated in FIG. 7A to the positions illustrated in FIG. 7C. The stationary blades 41*a* are fixed. The difference from the examples illustrated in FIGS. 5A to 5F and FIGS. 6A to 6F is that the angle θ of the plate members 21*a* illustrated in FIGS. 5A to 5F and FIGS. 6A to 6F is smaller than 90°, while the angle θ of the plate members 21*a* illustrated in FIGS. 7A to 7F is 90°, and the plate members 21*a* are disposed parallel to the vertical direction. At the positions illustrated in FIG. 7A, the exhaust path is closed (fully closed) by the plate members 21*a* and the stationary blades 41*a*, so that the processing gas in this operation example does not flow as illustrated in FIG. 70. Since the exhaust path is partially open at the positions illustrated in FIG. 7B, the processing gas begins to flow into the exhaust space 17 as illustrated in FIG. 7E. At the positions illustrated in FIG. 7C, the opening ratio is higher than that at the positions illustrated in FIG. 7B, and it is possible to increase the opening ratio to 90% or more, so that more processing gas can be controlled to flow into the exhaust space 17 as illustrated in FIG. 7F.

Operation Example 4

Figure 8A:
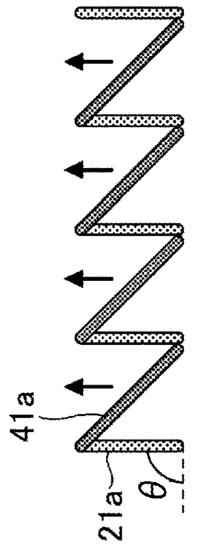
FIGS. 8A to 8F are diagrams illustrating an arrangement and an operation example 4 of multiple plate members and multiple stationary blades according to the embodiment.
Figure 8B:
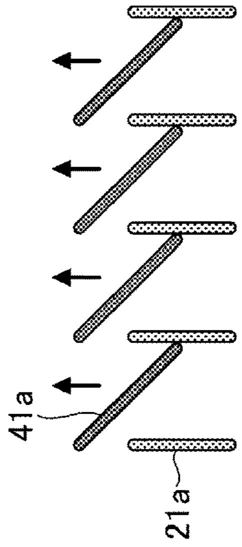
Figure 8C:
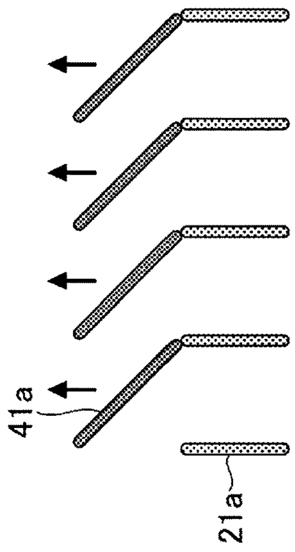
Figure 8D:
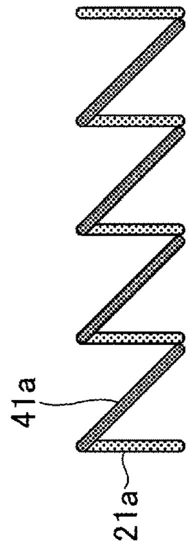
Figure 8E:
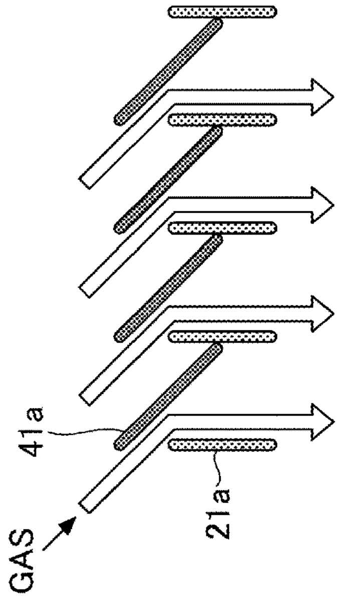
Figure 8F:
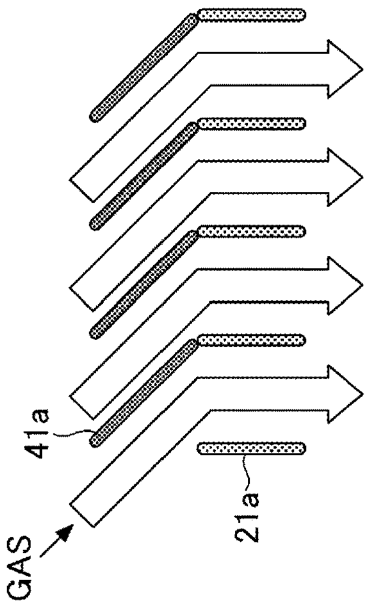

In an operation example 1 illustrated in FIG. 8A to 8F, the uppermost stationary blades 41*a* adjacent to the plate members 21*a* move vertically from the positions illustrated in FIG. 8A to the positions illustrated in FIG. 8C. All the stationary blades 41*a* except the uppermost stationary blade 41*a* do not move. The plate members 21*a* are fixed. At the position illustrated in FIG. 8A, the exhaust path is closed by the plate members 21*a* and the uppermost stationary blades 41*a* (fully closed), so that the processing gas in this operation example does not flow as illustrated in FIG. 8D. Since the exhaust path is partially open at the positions illustrated in FIG. 8B, the processing gas begins to flow into the exhaust space 17 as illustrated in FIG. 8E. At the positions illustrated in FIG. 8C, the opening ratio is higher than that at the positions illustrated in FIG. 8B, and it is possible to increase the opening ratio to 90% or more, so that more processing gas can be controlled to flow into the exhaust space 17 as illustrated in FIG. 8F.

Figure 9A:
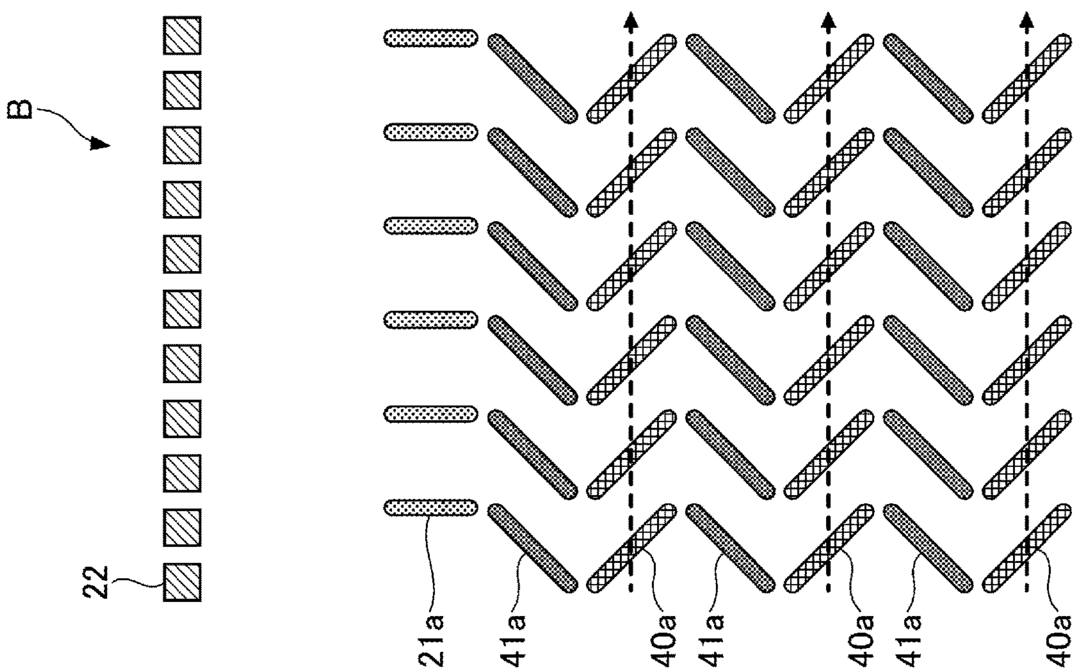
FIGS. 9A and 9B are diagrams illustrating an arrangement example 1 of plate members, stationary blades, and moving blades according to the embodiment.
Figure 9B:
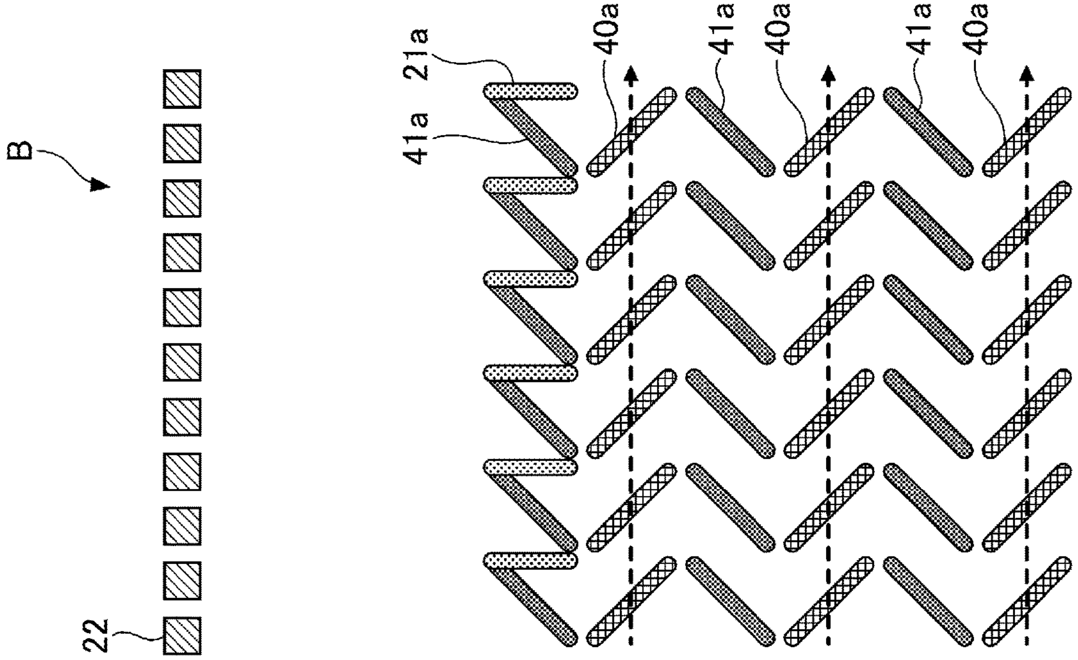
Figure 10B:
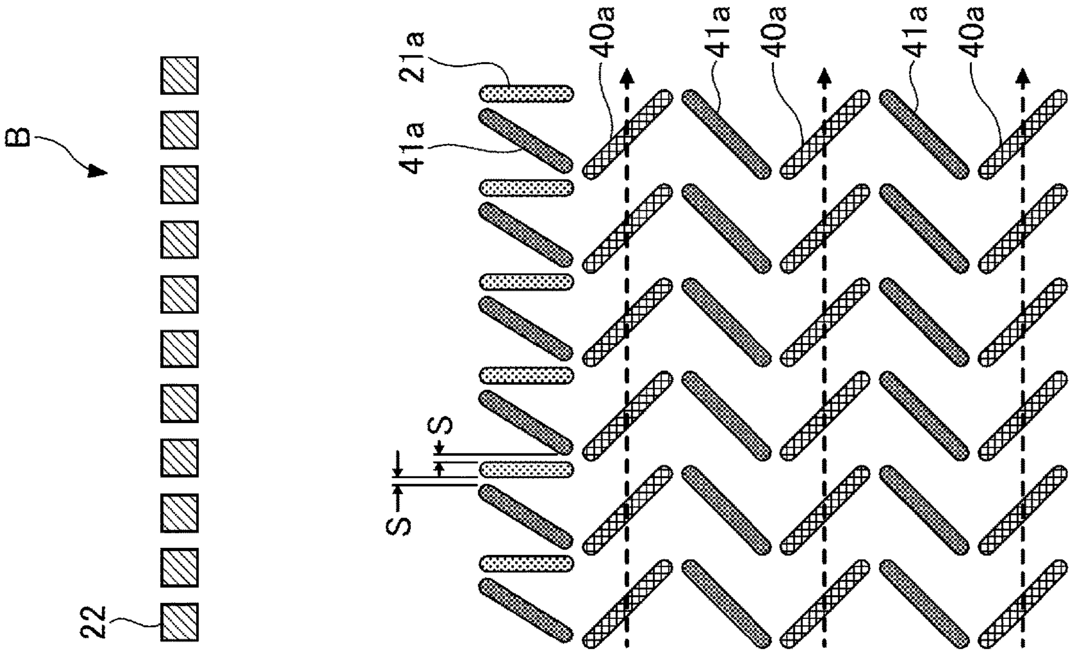
FIGS. 10A and 10B are diagrams illustrating an arrangement example 2 of plate members, stationary blades, and moving blades according to the embodiment.
Figure 10A:
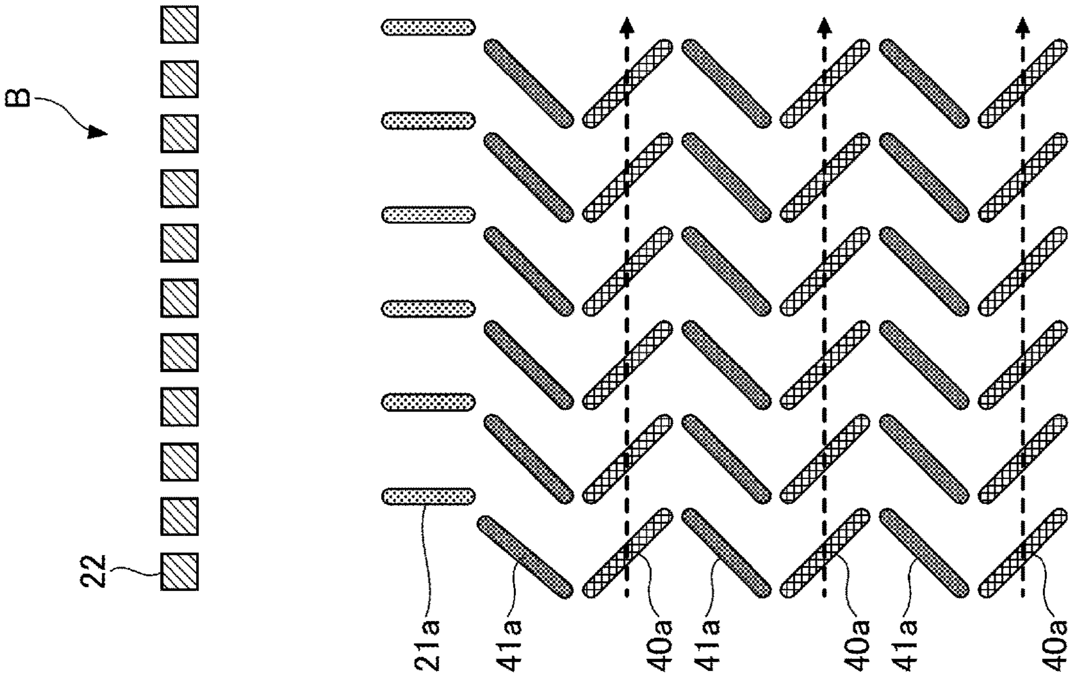

An example of the arrangement in which multiple moving blades 40*a* are added to the arrangement of the multiple plate members 21*a* and the multiple stationary blades 41*a* described above will be described with reference to FIGS. 9A and 9B and FIGS. 10A and 10B. FIGS. 9A and 9B are diagrams illustrating an arrangement example 1 of the plate members 21*a*, the stationary blades 41*a*, and the moving blades 40*a* according to the embodiment. FIGS. 10A and 10B are diagrams illustrating an example 2 of the arrangement of the plate members 21*a*, the stationary blades 41*a*, and the moving blades 40*a* according to the embodiment. FIGS. 9A and 9B and FIGS. 10A and 10B are schematic diagrams of the plate members 21*a*, the stationary blades 41*a*, and the moving blades 40*a* in the frame "B" illustrated in FIG. 1 when viewed from the side (for example, the A-A side in (c) of FIG. 2).

Arrangement Example 1 of Plate Members, Stationary Blades, and Moving Blades

FIGS. 9A and 9B are diagrams illustrating the plate members 21*a* and the uppermost stationary blades 41*a* illustrated in FIGS. 7A to 7F, beneath which multiple moving blades 40*a* and multiple stationary blades 41*a*, which are omitted in FIGS. 7A to 7F, are added.

Beneath the plate members 21*a* and the uppermost stationary blades 41*a*, multiple moving blades 40*a* and multiple stationary blades 41*a* are disposed alternately and in multiple stages. The multiple moving blades 40*a* are rotated by the first driver 51 in the direction indicated by dotted arrows. The rotation direction of the multiple moving blades 40*a* disposed in multiple stages can be either clockwise or counterclockwise as long as they are in the same direction.

In FIGS. 9A and 9B, the multiple plate members 21*a* are moved up and down (moved in the vertical direction) by the second driver 52. In FIG. 9A, the multiple plate members 21*a* are positioned higher than the multiple stationary blades 41*a*, and in FIG. 9B, the upper ends of the multiple plate members 21*a* are lowered to the same height as the upper ends of the multiple stationary blades 41*a*. When the multiple plate members 21*a* are in the positional relationship illustrated in FIG. 9A, the opening ratio of the exhaust path is the highest. When the multiple plate members 21*a* are in the positional relationship illustrated in FIG. 9B, the opening ratio of the exhaust path is the lowest. In this way, while controlling the rotational speed of the multiple moving blades 40*a*, the opening ratio of the exhaust path is controlled by the vertical movement of the multiple plate members 21*a*. As a result, the opening ratio of the exhaust path can be set to 90% or more, and the pressure adjustment range can be broadened. Therefore, the pressure regulating member 21 can control the flow of more processing gas into the exhaust space 17, and the exhaust pressure in the plasma processing chamber 10 can be controlled with high accuracy.

Arrangement Example 2 of Plate Blades, Stationary Blades, and Moving Blades

FIGS. 10A and 10B are diagrams illustrating the plate members 21*a* and the uppermost stationary blades 41*a* illustrated in FIGS. 7A to 7F, beneath which multiple moving blades 40*a* and multiple stationary blades 41*a* are added, as in FIGS. 9A and 9B. The difference from the plate members 21*a* and the stationary blades 41*a* illustrated in FIGS. 9A and 9B is that a gap S is provided between the plate members 21*a* and the adjacent stationary blades 41*a*. By providing a gap S, even when the plate members 21*a* and the stationary blades 41*a* expand or contract due to variable factors such as temperature change, for example, rubbing or breakage of the plate members 21*a* and the stationary blades 41*a* due to movement of the plate member 21*a* can be avoided.

As an example of the dimensions of the plate member 21*a* illustrated in FIGS. 10A and 10B, when the inner diameter of the plate member 21*a* is approximately 400 mm and the outer diameter is approximately 500 mm, the center diameter (diameter) e passing through the center of the thickness of the plate member 21*a* is approximately 450 mm, and the perimeter passing through the center of the thickness of the plate member 21*a* is approximately 1400 mm. For example, when the pressure regulating valve disposed in the exhaust device 20 is controlled at an opening equal to approximately 4% of the minimum opening, a gap of approximately 56 mm, which is 4% of 1400 mm, is provided.

For example, assuming that the plate member 21*a* and the uppermost stationary blade 41*a* are each composed of 10 sheets, each gap is 2.8 mm (=56/20) because there are 20 gaps (=10 sheets×2) in one perimeter. Assuming that the plate member 21*a* and the uppermost stationary blade 41*a* are each composed of 30 sheets, each gap is 0.9 mm. From the above results, it is considered that the gap S between the plate member 21*a* and the stationary blade 41*a* may be smaller than 0.8 mm. A gap S smaller than 0.8 mm may be provided between the plate member 21*a* and the stationary blade 41*a*.

As described above, the plate member 21*a* may be disposed vertically (angle 9=90°) or with an inclination in the circumferential direction (0°<angle θ<90°). In addition, the thickness of the plate member 21*a* can be set as desired.

On the other hand, the stationary blades 41*a* and the moving blades 40*a* are not disposed vertically, but are disposed with an inclination in the circumferential direction. By arranging the stationary blades 41*a* and the moving blades 40*a* with an inclination in the circumferential direction, the moving blades 40*a* can be rotated at a certain opening ratio, the conductance of gas in the exhaust path can be secured, and an appropriate flow of processing gas can be formed.

Arrangement Example 3 of Plate Members, Stationary Blades, and Moving Blades

An arrangement example 3 of the plate members 21*a* and the stationary blades 41*a* according to the embodiment will be described with reference to FIGS. 11A to 11C. As illustrated in the dotted oval frame "C" of FIG. 11A, the plasma processing apparatus 1 has the plate members 21*a* and the uppermost stationary blades 41*a*, and does not have the multi-stage moving blades 40*a* and stationary blades 41*a* beneath the plate members 21*a* and the uppermost stationary blades 41*a*. The configuration of the plasma processing apparatus 1 other than the configuration illustrated in the dotted oval frame "C" is the same as that of the plasma processing apparatus 1 in FIG. 1. Note that although the stationary member 41 is not illustrated in FIGS. 11A to 11C, in this configuration, the stationary member 41 includes the multiple stationary blades 41*a* as in the stationary member 41 in the configuration illustrated in FIG. 1.

Figure 11A:
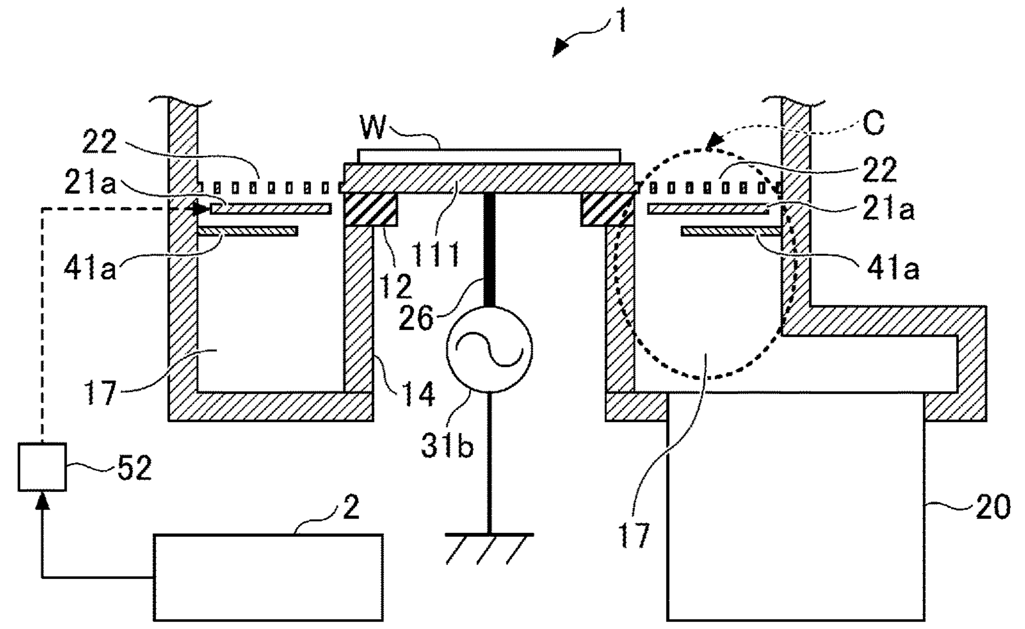
Figure 11B:
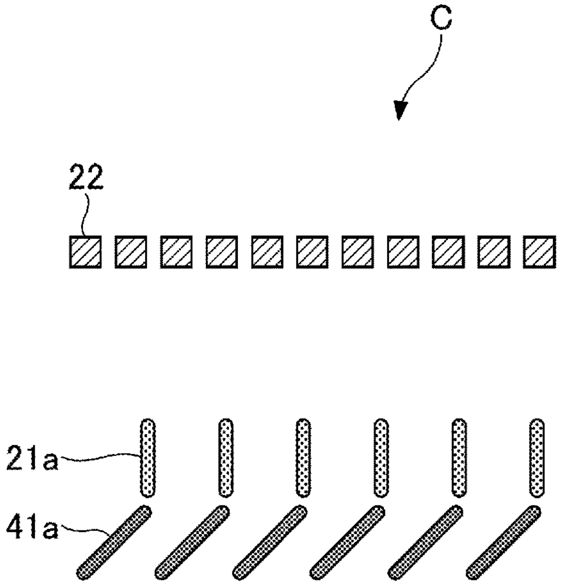
Figure 11C:
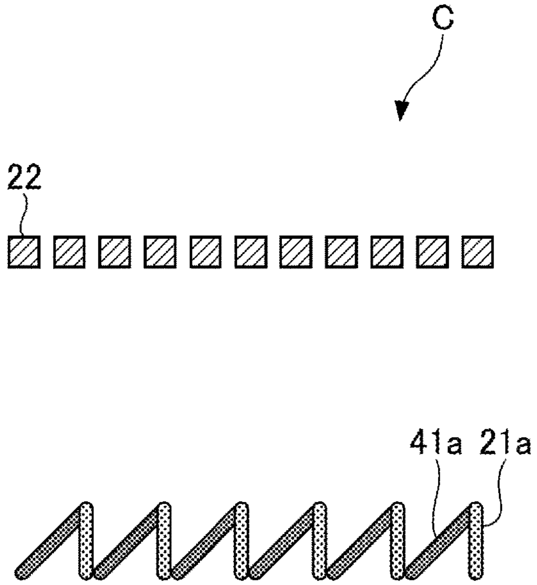

FIGS. 11B and 11C are schematic diagrams illustrating the plate member 21*a* and the stationary blade 41*a* in the dotted oval frame "C" illustrated in FIG. 11A when viewed from the side (for example, the A-A side in (c) of FIG. 2). There are no multiple moving blades 40*a* and no multiple stationary blades 41*a* beneath the plate members 21*a* and the uppermost stationary blades 41*a*. That is, only a single stage of the multiple stationary blade 41*a* is disposed beneath the pressure regulating member 21, and no multiple moving blades 40*a* are disposed.

Again, by moving the multiple plate members 21*a* by the second driver 52, the opening ratio of the exhaust path is maximized when the multiple plate members 21*a* are in the uppermost position, and the opening ratio of the exhaust path is minimized when the multiple plate members 21*a* are in the lowermost position. By controlling the opening ratio of the exhaust path by moving the multiple plate members 21*a* in this way, it is possible to increase the opening ratio to 90% or more. Thus, the adjustable pressure range by the pressure regulating members 21 can be broadened, more processing gas can be controlled to flow into the exhaust space 17, and the exhaust pressure in the plasma processing chamber 10 can be precisely controlled.

Second Driver

Figure 12B:
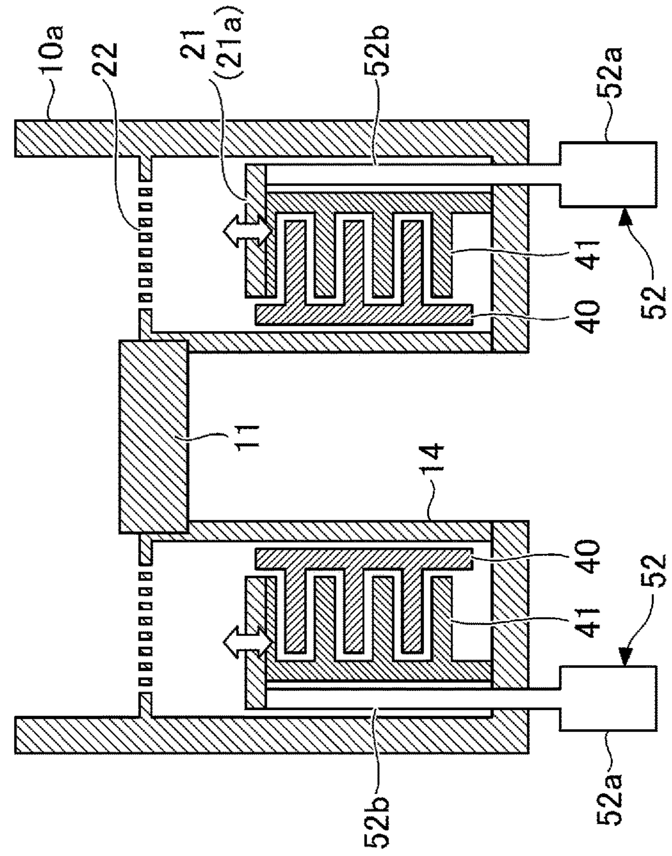
FIGS. 12A and 12B are diagrams illustrating a configuration of a second driver according to the embodiment.
Figure 12A:
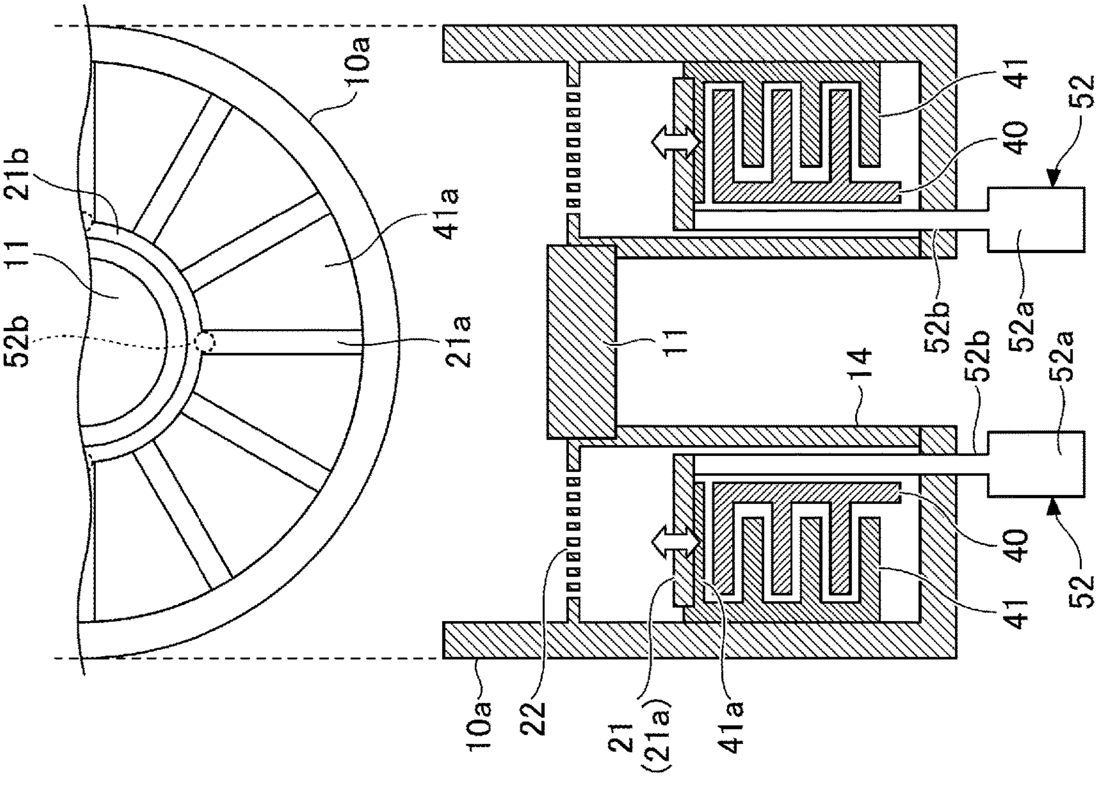
Figure 13B:
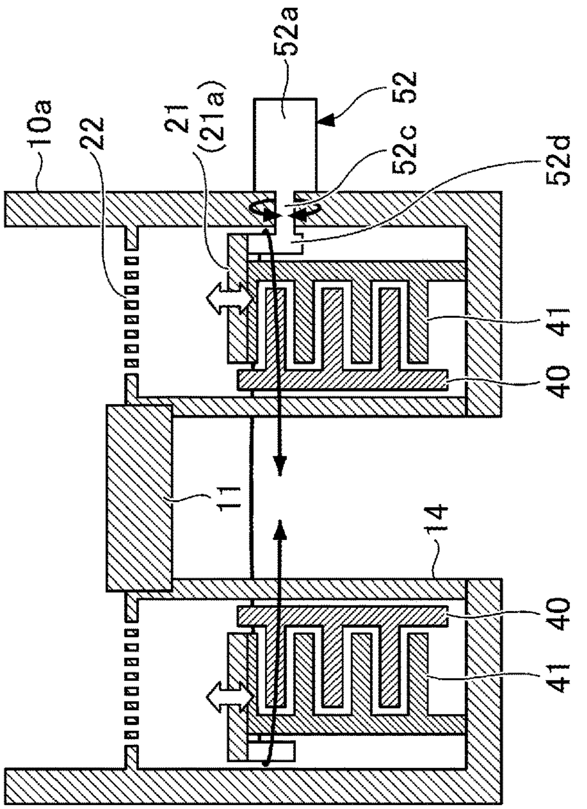
FIGS. 13A and 13B are diagrams illustrating another configuration of a second driver according to the embodiment.
Figure 13A:
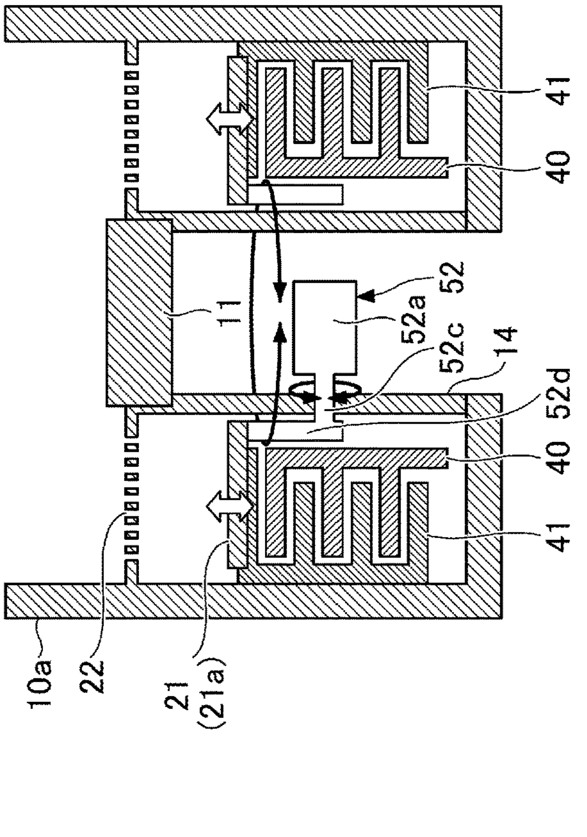

Finally, an example of the configuration and operation of the second driver 52 according to the embodiment will be described with reference to FIGS. 12A and 12B, and FIGS. 13A and 13B. FIGS. 12A and 12B are diagrams illustrating a configuration of the second driver 52 according to the embodiment. FIGS. 13A and 13B are diagrams illustrating another configuration of the second driver 52 according to the embodiment.

FIGS. 12A and 12B are diagrams each illustrating a configuration of the second driver 52. FIG. 12A further illustrates the inside of the plasma processing chamber 10 when viewed from beneath the baffle plate 22 in plan view.

The second driver 52 in FIG. 12A has actuators 52*a* and support members 52*b*. The support members 52*b* are each disposed between the substrate support 11 (support 14) and the movable member 40. In addition, as illustrated in the plan diagram of FIG. 12A, the support members 52*b* are rod-shaped, are disposed at equal intervals in the circumferential direction, and are each fixed to the lower surface of the pressure regulating member 21. The multiple support members 52*b* are moved up and down (in the vertical direction) by one or more actuators 52*a*, which cause the multiple plate members 21*a* of the pressure regulating member 21 to move up and down.

The second driver 52 in FIG. 12B has actuators 52*a* and support members 52*b*. The support members 52*b* are each positioned between the side wall 10*a* of the plasma processing chamber 10 and the stationary member 41. The support members 52*b* are rod-shaped, and are disposed in a multiple number at equal intervals in the circumferential direction, and each is fixed to the lower surface of the pressure regulating member 21. When the multiple support members 52*b* are moved up and down (in the vertical direction) by one or more actuators 52*a*, the multiple plate members 21*a* of the pressure regulating member 21 are moved up and down (in the vertical direction). In FIGS. 12A and 12B, the support member 52*b* may be cylindrical. In both FIGS. 12A and 12B, the support member 52*b* penetrates a lower portion of the plasma processing chamber 10 to keep the vacuum space sealed inside the plasma processing chamber 10. However, the support member 52*b* may penetrate an upper portion of the plasma processing chamber 10. The actuator 52*a* may also be disposed inside the plasma processing chamber 10.

FIGS. 13A and 13B are diagrams each illustrating another configuration of the second driver 52. The second driver 52 in FIG. 13A has an actuator 52*a*, a gear 52*c*, and a screw 52*d*. The actuator 52*a* is disposed in atmospheric space inside the support 14. The screw 52*d* is disposed in the vacuum space (exhaust path). The gear 52*c* horizontally penetrates the support 14, is connected to the actuator 52*a* at one end, and engages with the thread formed in the screw 52*d* at the other end. The screw 52*d* is cylindrical and is positioned between the substrate support 11 (support 14) and the movable member 40. The upper end of the screw 52*d* is fixed to the lower surface of the pressure regulating member 21. When the gear 52*c* is rotated about the axis (longitudinal arrow in FIG. 13A) by the actuator 52*a* (rotary motor), the screw 52*d* engages the gear 52*c* and rotates along the support 14 about the central axis CL (see FIG. 1) (lateral arrow in FIG. 13A). The screw 52*d* and the support 14 have a ball-bearing structure, and instead of the support 14 moving up and down due to the rotation of the screw 52*d*, the screw 52*d* moves vertically with respect to the rotating surface, that is, moves in the vertical direction while rotating with respect to the fixed support 14. As a result, the multiple plate members 21*a* of the pressure regulating member 21 move up and down while rotating.

The second driver 52 in FIG. 13B also has an actuator 52*a*, a gear 52*c*, and a screw 52*d*. The actuator 52*a* is disposed in the atmospheric space near the side wall 10*a* of the plasma processing chamber 10. The screw 52*d* is disposed in the vacuum space (exhaust path). The gear 52*c* horizontally penetrates the side wall 10*a*, is connected to the actuator 52*a* at one, end and engages with the thread formed in the screw 52*d* at the other end. The screw 52*d* is cylindrical and is positioned between the side wall 10*a* and the stationary member 41. The upper end of the screw 52*d* is fixed to the lower surface of the pressure regulating member 21. When the gear 52*c* is rotated about the axis (longitudinal arrow in FIG. 13B) by the actuator 52*a* (rotary motor), the screw 52*d* is engaged with the gear 52*c* and rotated along the side wall 10*a* around the central axis CL (see FIG. 1) (lateral arrow in FIG. 13B). The screw 52*d* and the side wall 10*a* have a ball bearing structure, and instead of the side wall 10*a* being moved up and down by the rotation of the screw 52*d*, the screw 52*d* is rotated with respect to the fixed side wall 10*a* and moves vertically with respect to the rotating surface, that is, moves up and down. As a result, the multiple plate members 21*a* of the pressure regulating member 21 are moved up and down while rotating.

According to the configuration of the second driver 52 illustrated in FIGS. 12A and 12B, the second driver 52 can move the pressure regulating member 21 up and down. For example, the up and down movements of the multiple plate members 21*a* illustrated in FIGS. 5A to 5F, FIGS. 7A to 7F and FIGS. 8A to 8F can be implemented.

According to the configurations of the second driver 52 illustrated in FIGS. 13A and 13B, the second driver 52 can move the pressure regulating member 21 up and down while rotating the pressure regulating member 21. For example, the up and down movements of the multiple plate members 21*a* illustrated in FIGS. 5A to 5F, FIGS. 7A to 7F, and FIGS. 8A to 8F can be implemented. In addition, the movements of the multiple plate members 21*a* illustrated in FIGS. 6A to 6F can be implemented by converting the rotational motion of the pressure regulating member 21 into the diagonal linear motion of the multiple plate members 21*a* using the ball bearing structure of the screw 52*d* and the support 14, etc.

As described above, in the plasma processing apparatus 1 according to the present embodiment, the exhaust pressure in the plasma processing chamber 10 can be controlled with high accuracy.

The plasma processing apparatus according to the present disclosure should be considered as an example and not a limitation in all respects. The embodiments may be modified and improved in various forms without departing from the scope and intent of the attached claims. The matters described in the above multiple embodiment(s) can be composed of other configurations to the extent that they are not inconsistent and can be combined to the extent that they are not inconsistent.

For example, the plasma processing apparatus according to the embodiment(s) may be applied to either a single wafer processing apparatus for processing substrates one by one, a batch apparatus for processing multiple substrates all at once, or a semi-batch apparatus.

According to one aspect of the present disclosure, the exhaust pressure in the plasma processing chamber can be precisely controlled.

The present disclosures non-exhaustively include the subject matter set out in the following clauses:

(Clause 1)

A plasma processing apparatus including:

a plasma processing chamber;

a substrate support disposed in the plasma processing chamber;

a stationary member disposed around the substrate support, the stationary member having a plurality of stationary blades, and an exhaust space being formed beneath the stationary member;

a pressure regulating member movably disposed around the substrate support and above the stationary member; and a driver configured to move the pressure regulating member.

(Clause 2)

The plasma processing apparatus according to clause 1, wherein the pressure regulating member has a plurality of plate members circumferentially disposed around the substrate support.

(Clause 3)

The plasma processing apparatus according to clause 2, wherein the plurality of plate members are disposed non-parallel to the plurality of stationary blades.

(Clause 4)

The plasma processing apparatus according to any one of clauses 1 to 3, wherein the driver is positioned between the substrate support and the stationary member.

(Clause 5)

The plasma processing apparatus according to any one of clauses 1 to 3, wherein the driver is positioned between a side wall of the plasma processing chamber and the stationary member.

(Clause 6)

The plasma processing apparatus according to any one of clauses 1 to 3, wherein the substrate support includes an electrostatic chuck and a base disposed beneath the electrostatic chuck, and a feeding rod is electrically connected to the base.

(Clause 7)

The plasma processing apparatus according to clause 6, wherein the feeding rod is coaxially disposed with the base.

(Clause 8)

The plasma processing apparatus according to clause 6, wherein the feeding rod is coaxially disposed with the stationary member.

(Clause 9)

The plasma processing apparatus according to any one of clauses 1 to 3, wherein the driver is configured to move the pressure regulating member in a vertical direction while rotating the pressure regulating member.

(Clause 10)

The plasma processing apparatus according to any one of clauses 1 to 3, further including at least one movable baffle plate above the pressure regulating member.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:

a plasma processing chamber;

a substrate support disposed in the plasma processing chamber;

a movable member and a stationary member, each disposed around the substrate support, the movable member having a plurality of moving blades, the plurality of moving blades being rotatable, the stationary member having a plurality of stationary blades, the plurality of moving blades and the plurality of stationary blades being alternately disposed along a height direction of the plasma processing chamber, and an exhaust space being formed beneath the movable member and the stationary member;

a first driver configured to rotate the movable member;

a pressure regulating member movably disposed above the movable member and the stationary member, a radially inner portion of the pressure regulating member being disposed radially outside the substrate support; and a second driver configured to move the pressure regulating member.

2. The plasma processing apparatus according to claim 1, wherein the pressure regulating member has a plurality of plate members disposed around the substrate support, and the plurality of plate members and the plurality of stationary blades are alternately disposed in a circumferential direction.

3. The plasma processing apparatus according to claim 2, wherein the plurality of plate members are disposed non-parallel to the plurality of moving blades or the plurality of stationary blades.

4. The plasma processing apparatus according to claim 1, wherein the second driver is positioned between the substrate support and the movable member.

5. The plasma processing apparatus according to claim 1, wherein the second driver is positioned between a side wall of the plasma processing chamber and the stationary member.

6. The plasma processing apparatus according to claim 1, wherein the substrate support includes an electrostatic chuck and a base disposed beneath the electrostatic chuck, and a feeding rod is electrically connected to the base.

7. The plasma processing apparatus according to claim 6, wherein the feeding rod is coaxially disposed with the base.

8. The plasma processing apparatus according to claim 6, wherein the feeding rod is coaxially disposed with the movable member and the stationary member.

9. The plasma processing apparatus according to claim 1, wherein the second driver is configured to move the pressure regulating member in a vertical direction while rotating the pressure regulating member.

10. The plasma processing apparatus according to claim 1, further comprising:

at least one movable baffle plate above the pressure regulating member.

11. A plasma processing apparatus comprising:

a plasma processing chamber;

a substrate support disposed in the plasma processing chamber;

a stationary member disposed around the substrate support, the stationary member having a plurality of stationary blades, and an exhaust space being formed beneath the stationary member;

a pressure regulating member movably disposed above the stationary member, a radially inner portion of the pressure regulating member being disposed radially outside the substrate support; and a driver configured to move the pressure regulating member.

12. The plasma processing apparatus according to claim 11, wherein the pressure regulating member has a plurality of plate members disposed around the substrate support, and the plurality of plate members and the plurality of stationary blades are alternately disposed in a circumferential direction.

13. The plasma processing apparatus according to claim 12, wherein the plurality of plate members are disposed non-parallel to the plurality of stationary blades.

14. The plasma processing apparatus according to claim 11, wherein the driver is positioned between the substrate support and the stationary member.

15. The plasma processing apparatus according to claim 11, wherein the driver is positioned between a side wall of the plasma processing chamber and the stationary member.

16. The plasma processing apparatus according to claim 11, wherein the substrate support includes an electrostatic chuck and a base disposed beneath the electrostatic chuck, and a feeding rod is electrically connected to the base.

17. The plasma processing apparatus according to claim 16, wherein the feeding rod is coaxially disposed with the base.

18. The plasma processing apparatus according to claim 16, wherein the feeding rod is coaxially disposed with the stationary member.

19. The plasma processing apparatus according to claim 11, wherein the driver is configured to move the pressure regulating member in a vertical direction while rotating the pressure regulating member.

20. The plasma processing apparatus according to claim 11, further comprising:

at least one movable baffle plate above the pressure regulating member.

* * * * *